(12) United States Patent
Chen et al.

(10) Patent No.: US 11,592,740 B2
(45) Date of Patent: Feb. 28, 2023

(54) WIRE GRID POLARIZER MANUFACTURING METHODS USING FREQUENCY DOUBLING INTERFERENCE LITHOGRAPHY

(71) Applicant: Applied Materials, Inc., Santa Clara, CA (US)

(72) Inventors: Jang Fung Chen, Cupertino, CA (US); Christopher Dennis Bencher, Cupertino, CA (US); David Markle, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/961,601

(22) Filed: Apr. 24, 2018

(65) Prior Publication Data
US 2018/0335694 A1 Nov. 22, 2018

Related U.S. Application Data

(60) Provisional application No. 62/506,662, filed on May 16, 2017.

(51) Int. Cl.
*G03F 7/00* (2006.01)
*G02F 1/1335* (2006.01)
(Continued)

(52) U.S. Cl.
CPC ......... *G03F 7/0002* (2013.01); *G02B 5/3058* (2013.01); *G02F 1/133528* (2013.01); *G03F 7/70408* (2013.01); *G02F 1/133548* (2021.01)

(58) Field of Classification Search
CPC .... G02B 5/3058; G03F 7/702; G03F 7/70158
See application file for complete search history.

(56) References Cited

U.S. PATENT DOCUMENTS

| 4,964,705 A | * | 10/1990 | Markle | ................ G02B 17/008 359/727 |
| 5,087,547 A | * | 2/1992 | Taylor | .................. G03F 7/0226 430/169 |

(Continued)

FOREIGN PATENT DOCUMENTS

| CN | 1559023 A | 12/2004 |
| CN | 1661478 A | 8/2005 |

(Continued)

OTHER PUBLICATIONS

Grenville et al., Masks for Markle-Dyson optics, Feb. 15, 1994.*
(Continued)

*Primary Examiner* — Alex A Rolland
(74) *Attorney, Agent, or Firm* — Patterson + Sheridan, LLP

(57) ABSTRACT

The present disclosure generally relates to methods and systems for manufacturing wire grid polarizers (WGP) using Markle-Dyson exposure systems and dual tone development (DTD) frequency doubling. In one embodiment, the method includes depositing a photoresist layer over an aluminum-coated display substrate, patterning the photoresist layer by dual tone development using a Markle-Dyson system to form a photoresist pattern, and transferring the photoresist pattern into the aluminum-coated display substrate to manufacture a WGP having finer pitch, for example less than or equal to about 100 nm, and increased frequency.

19 Claims, 9 Drawing Sheets

(51) Int. Cl.
*G02B 5/30* (2006.01)
*G03F 7/20* (2006.01)

(56) References Cited

U.S. PATENT DOCUMENTS

| | | | |
|---|---|---|---|
| 5,402,205 A * | 3/1995 | Markle | G03F 9/70 |
| | | | 355/43 |
| 5,438,204 A | 8/1995 | von Bunau et al. | |
| 6,114,082 A * | 9/2000 | Hakey | G03F 7/038 |
| | | | 430/270.1 |
| 6,372,412 B1 | 4/2002 | Hakey et al. | |
| 6,532,111 B2 | 3/2003 | Kurtz et al. | |
| 6,977,702 B2 | 12/2005 | Wu | |
| 7,561,332 B2 | 7/2009 | Little et al. | |
| 7,692,860 B2 | 4/2010 | Sato et al. | |
| 2003/0077539 A1 * | 4/2003 | Lu | G03F 7/0382 |
| | | | 430/270.1 |
| 2003/0128870 A1 | 7/2003 | Pease et al. | |
| 2004/0169924 A1 | 9/2004 | Flagello et al. | |
| 2007/0165307 A1 | 7/2007 | Perkins | |
| 2008/0094547 A1 | 4/2008 | Sugita et al. | |
| 2010/0075238 A1 | 3/2010 | Fonseca et al. | |
| 2012/0183739 A1 | 7/2012 | Kim et al. | |
| 2013/0153534 A1 | 6/2013 | Resnick et al. | |
| 2015/0036083 A1 | 2/2015 | Jang et al. | |
| 2015/0309411 A1 * | 10/2015 | Hwang | G03F 7/2022 |
| | | | 355/77 |
| 2016/0131811 A1 | 5/2016 | Lee et al. | |

FOREIGN PATENT DOCUMENTS

| | | |
|---|---|---|
| CN | 102667544 A | 9/2012 |
| CN | 103777462 A | 5/2014 |
| CN | 104221127 A | 12/2014 |
| EP | 1684099 A2 | 7/2006 |
| JP | H2181717 A | 7/1990 |
| JP | H04217250 A | 8/1992 |
| JP | H10104834 A | 4/1998 |
| JP | 2003347185 A | 12/2003 |
| JP | 2005504362 A | 2/2005 |
| JP | 2009157071 A | 7/2009 |
| JP | 2009169213 A | 7/2009 |
| JP | 6051519 B2 | 12/2016 |
| KR | 100880699 B1 | 2/2009 |
| KR | 20150122516 A | 11/2015 |
| WO | 03029900 A1 | 4/2003 |
| WO | 2017/151291 A1 | 9/2017 |

OTHER PUBLICATIONS

Wang et al., High-performance, large area, deep ultraviolet to infrared polarizers based on 40 nm line/78nm space nanowire grids, 2007.*
International Search Report and Written Opinion dated Aug. 9, 2018 for Application No. PCT/US2018/029087.
Zhibing Ge and Shin-Tson Wu; "Nanowire grid polarizer for energy efficient and wide-view liquid crystal displays", Applied Physics Letters 93, 121140 (2008).
Wang, Jian Jim et al.; "High-performance, large area, deep ultraviolet to infrared polarizers based on 40 nm line/78 nm space nanowires grids", Applied Physics Letters 60, 061140 (2007).
Wang, Jian Jim et al.; "30-nm-wide aluminum nanowire grid for ultrahigh contrast and transmittance polarizers made by UV-nanoimprint lithography", Applied Physics Letters 89, 141105 (2006).
Ahn, She-Won et al.; "Fabrication of a 50 nm half-pitch wire grid polarizer using nanoimprint lithography", Institute of Physics Publishing, Nanotechnology 16 (2005).
Fonseca, Carlos et al.; "Advances in dual-tone development for pitch frequency doubling", Proc. Of SPIE, vol. 7640, 76400E-1.
Hori, Yoichi et al.; "Development of Materials-based Pitch Split Process", Journal of Photopolymer Science and Technology, vol. 29, No. 1 (2016).
Indutnyi, I. Z. et al.; "Spatial frequency doubling of interference lithographic structure using two-layer chalcogenide photoresist", Journal of Optoelectronics and Advance Materials, vol. 13, No. 11-12 (2011).
International Search Report and Written Opinion dated Apr. 25, 2017 for Application No. PCT/US2017/017319.
Korean Office Action dated Apr. 15, 2021 for Application No. 10-2020-7000189.
Japanese Office Action dated Jan. 5, 2021 for Application No. 2019-563575.
Korea Office Action dated Feb. 19, 2021 for Application No. 10-2019-7036834.
Chinese Office Action issued to Serial No. 201880038858.3 dated Jul. 8, 2021.

* cited by examiner

WIRE GRID POLARIZER MANUFACTURING METHODS USING FREQUENCY DOUBLING INTERFERENCE LITHOGRAPHY

CROSS-REFERENCE TO RELATED APPLICATIONS

This application claims benefit of U.S. Provisional Patent Application Ser. No. 62/506,662, filed on May 16, 2017, which is herein incorporated by reference in its entirety.

BACKGROUND

Field

Embodiments of the present disclosure generally relate to flat panel display manufacturing processes. More specifically, systems and methods for manufacturing wire grid polarizers for liquid crystal displays (LCDs) are disclosed.

Description of the Related Art

An LCD is a display that uses the light-modulating properties of liquid crystals sandwiched between crossed polarizers to display images. LCDs are used in a wide range of applications, including, but not limited to, high definition televisions, computer monitors, and mobile devices. In a typical LCD, the liquid crystal cells are aligned between two linear polarizers, which are oriented orthogonally to one another such that their optical axes are crossed. The polarizers are used to enhance the contrast ratio by blocking internal reflected light from entering a viewer's eyes.

Conventionally, polarizing films have been used as the linear polarizers. The polarizing films allow light polarized perpendicular to the conductor lines of the polarizer to pass through, while reflecting the light polarized parallel to the conductor lines of the polarizer. However, polarizing films are very costly. In fact, polarizing films often account for more than 30% of the total cost of an LCD panel. In addition, polarizing films have a lower extinction ratio, which is a measure of the film's ability to attenuate light polarized perpendicular to the film's transmission axis.

More recently, Wire Grid Polarizers (WGP) have been used to convert an un-polarized beam into a beam with a single linear polarization. A WGP includes a horizontal array of microscopic metallic wires on a glass substrate, which selectively transmit p-polarized light while reflecting s-polarized light. A WGP is placed in a plane perpendicular to the incident light beam. The electric fields aligned parallel (s-polarization) to the wires induce the movement of electrons along the length of the wires. Since the electrons move freely in the metal grids, the WGP behaves in a similar manner as the surface of a metal when reflecting light. Minor energy is lost due to heating in the wires and the rest of the wave is reflected backwards along the incident light beam. For the electric fields aligned perpendicular (p-polarization) to the wires, the electrons cannot move very far across the width of each wire. Therefore, little energy is lost nor reflected and the incident light beam is able to travel through the WGP. As a result, the transmitted wave becomes linearly polarized since it now has an electric field purely in the direction perpendicular to the wires.

Additionally, WGPs have higher extinction ratios than polarizing films and thus have better performance. As such, WGPs have been used for light emitting diodes (LEDs), such as OLEDs and AMOLEDs. As device dimensions continue to shrink and consumer demand for better resolution devices continues to increase, WGP production techniques for these applications becomes more complicated because the wire grid needs to be more thin and have reduced feature pitch in order to avoid affecting the LED's efficiency or the display's color resolution.

Therefore, there is a need for improved methods and systems for manufacturing WGPs having finer feature pitch, such as less than or equal to 100 nanometers (nm).

SUMMARY

The present disclosure generally relates to methods and systems for manufacturing wire grid polarizers (WGP) using Markle-Dyson exposure systems and dual tone development (DTD) frequency doubling. In one embodiment, the method includes depositing a photoresist layer over an aluminum-coated display substrate, patterning the photoresist layer by dual tone development using a Markle-Dyson system to form a photoresist pattern, and transferring the photoresist pattern into the aluminum-coated display substrate to manufacture a WGP having finer pitch, for example less than or equal to about 100 nm, and increased frequency.

In one embodiment, a method for manufacturing a wire grid polarizer is disclosed. The method includes depositing a photoresist layer over an aluminum-coated display substrate, patterning the photoresist layer by dual tone development using a Markle-Dyson system to form a photoresist pattern, and transferring the photoresist pattern into the aluminum-coated display substrate.

In another embodiment, a wire grid polarizer manufacturing method is disclosed. The method includes depositing a bottom anti-reflective coating layer over an aluminum-coated display substrate, depositing a photoresist layer over the aluminum-coated display substrate, patterning the photoresist layer by dual tone development using a Markle-Dyson system to form a photoresist pattern, transferring the photoresist pattern into the aluminum-coated display substrate, and removing any remaining photoresist from the aluminum-coated display substrate.

In yet another embodiment, a wire grid polarizer manufacturing method is disclosed. The method includes depositing a photoresist layer over an aluminum-coated display substrate, patterning the photoresist layer by dual tone development using a Markle-Dyson system to form a photoresist pattern, the photoresist pattern having high light exposure intensity portions, middle light exposure intensity portions, and low light exposure intensity portions, and the dual tone development including removing the high light exposure intensity portions using a first developing solution and removing the low light exposure intensity portions using a second developing solution, etching the photoresist pattern into the aluminum-coated display substrate, and removing any remaining photoresist from the aluminum-coated display substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

The present disclosure generally relates to methods and systems for manufacturing wire grid polarizers (WGP) using Markle-Dyson exposure systems and dual tone development (DTD) frequency doubling. In one embodiment, the method includes depositing a photoresist layer over an aluminum-coated display substrate, patterning the photoresist layer by dual tone development using a Markle-Dyson system to form a photoresist pattern, and transferring the photoresist pattern into the aluminum-coated display substrate to manufacture a WGP having finer pitch, for example less than or equal to about 100 nm, and increased frequency.

Figure 1:
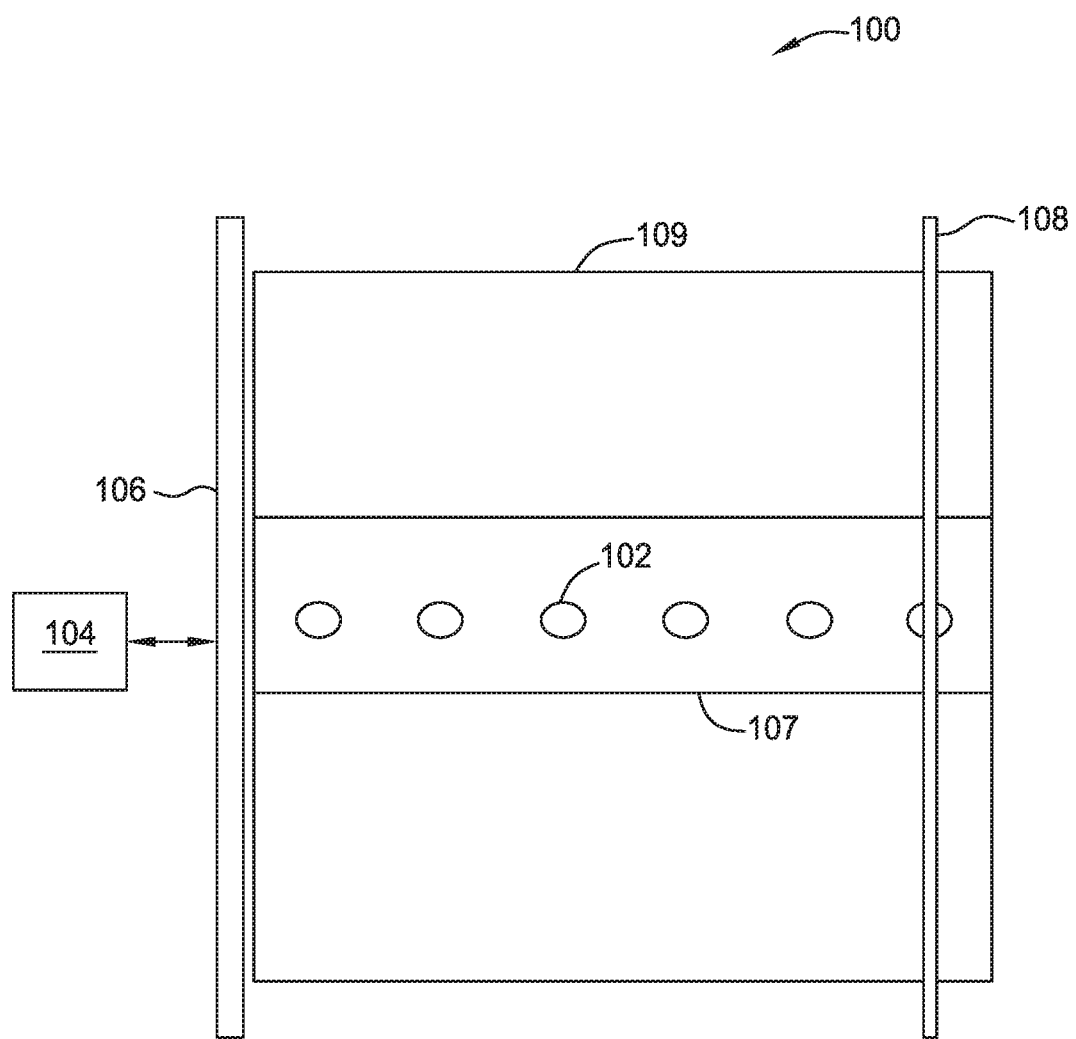
FIG. 1 is a lithography system for printing a WGP pattern onto a display substrate according to embodiments described herein.

FIG. 1 is a system 100 for printing a WGP pattern onto a flat panel display substrate. The system 100 includes a plurality of Markle-Dyson (or "half Dyson") exposure systems 102 (six are shown), a laser gage 104, a laser gage mirror 106 and a substrate stage 109. The plurality of Markle-Dyson exposure systems 102 are generally evenly distributed across the width of the substrate stage 109, which is configured to support a large area substrate. For example, when the system 100 is configured for patterning a Gen 8 flat panel display, having a width of about 2200 millimeters (mm) and a length of about 2500 mm, the spacing between each of the Markle-Dyson exposure systems 102 is generally about 367 mm. In further embodiments, the system 100 is configured to pattern Gen 8, Gen 10 and future generation flat panel display substrates. In operation, the plurality of Markle-Dyson exposure systems 102 are generally used in parallel to pattern fine geometry lines and spaces of a WGP for a large area substrate.

As shown in FIG. 1, the system 100 has six Markle-Dyson exposure systems 102 corresponding to six columns across the width of the flat panel display substrate. In use, each column generally operates in parallel to write a scan path 108, for example a 13.3 mm wide scan path, of the flat panel display substrate. In one embodiment, the Markle-Dyson exposure systems 102 are disposed on bridge 107, which is spaced above a substrate stage 109, as shown in FIG. 1.

Figure 2A:
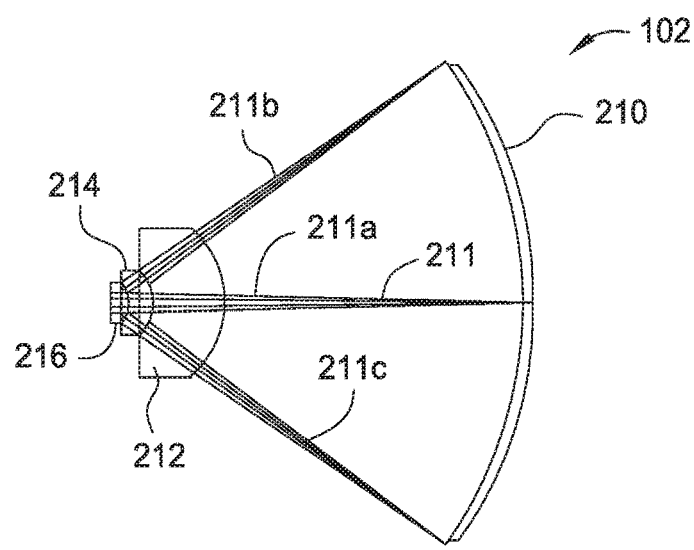
FIG. 2A is a Markle-Dyson exposure system of the lithography system of FIG. 1 according to embodiments described herein.

FIG. 2A is a Markle-Dyson exposure system 102 of the system 100. The Markle-Dyson exposure system 102 generally includes a primary mirror 210, a positive lens 214, a meniscus lens 212, and a reticle 216. In one embodiment, the primary mirror 210 is a weakly aspheric mirror. In one embodiment, the positive lens 214 is a glass lens. In another embodiment, the positive lens 214 is made from a fused silica, calcium difluoride ($CaF_2$) crystal, or any other suitable material. In one embodiment, the reticle 216 has a height of between about 10 mm and about 20 mm, such as about 14 mm, and a thickness of between about 1 mm and about 6.35 mm, such as about 2.286 mm.

Figure 2B:
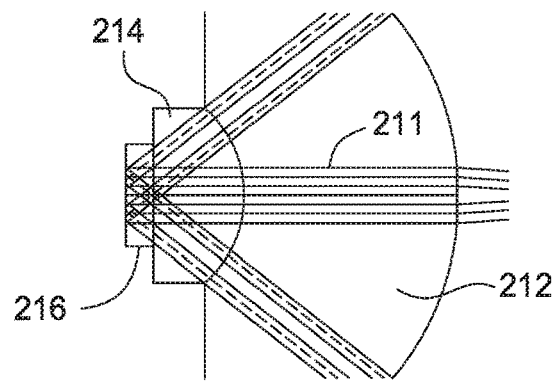
FIG. 2B is an enlarged view of a portion of the Markle-Dyson system of FIG. 2A according to embodiments described herein.
Figure 2C:
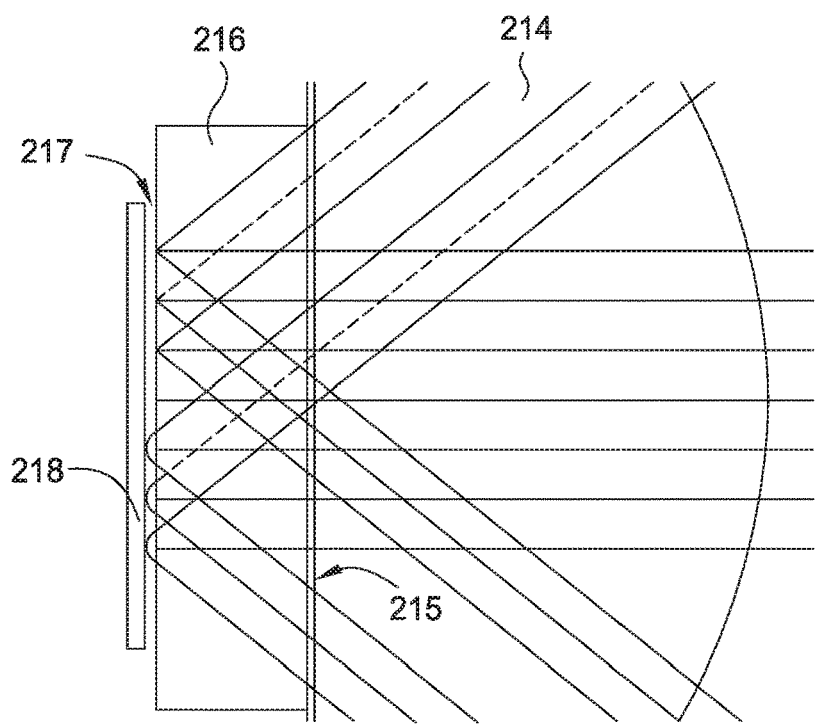
FIG. 2C is an enlarged view of a portion of the portion of the Markle-Dyson system of FIG. 2B according to embodiments described herein.

FIG. 2B is an enlarged view of a portion of the Markle-Dyson exposure system 102 of FIG. 2A. FIG. 2C is an enlarged view of a portion of the portion of the Markle-Dyson exposure system 102 of FIG. 2B. As shown in FIG. 2C, a flat panel display substrate 218 is positioned adjacent to the reticle 216. The flat panel display substrate 218 is separated from the reticle 216 by a first air gap 217. The first air gap 217 generally has any suitable width, for example, between about 0.1 mm and about 0.5 mm, such as about 0.25 mm. The reticle 216 is separated from the positive lens 214 by a second air gap 215 or it is optically coupled with an optical gel or optical cement or any other suitable material. The second air gap 215 has any suitable width, for example, between about 0.1 mm and about 0.5 mm, such as about 0.25 mm. In one embodiment, the second air gap 215 is also filled with an optical gel or optical cement or any other suitable material. Other suitable materials include those materials having an index of refraction that matches the optical materials on either side at the exposure wavelength.

Figure 3:
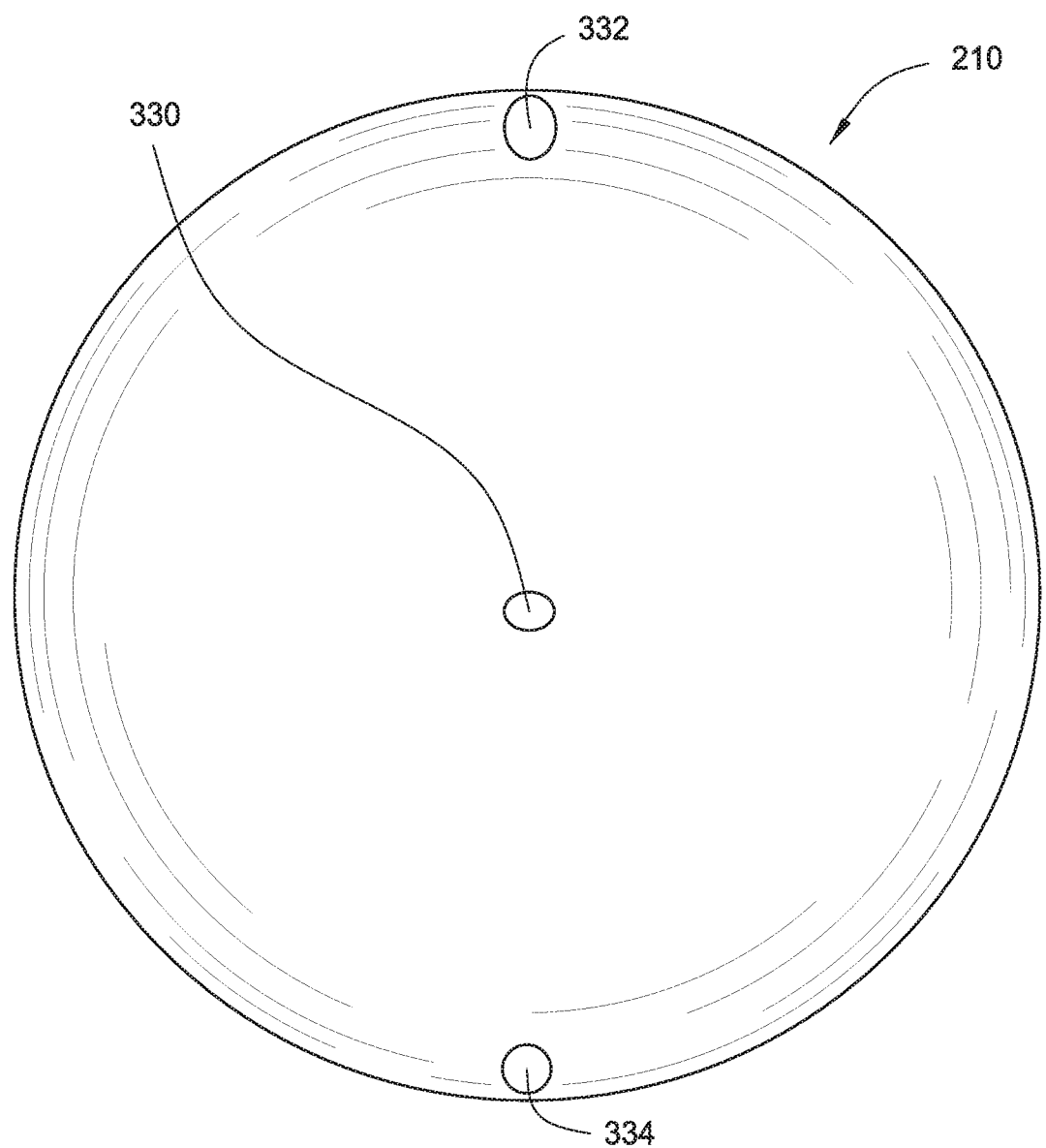
FIG. 3 is a plan view of a primary mirror, which is useful in the Markle-Dyson system of FIG. 2A according to embodiments described herein.

FIG. 3 is a plan view of the primary mirror 210 of the Markle-Dyson exposure system 102. The primary mirror 210 generally includes a centrally-located opening 330 through which the illumination beam 211 on the mask emerges and which is collimated on the reflective, phase grating mask to generate ±1 diffraction orders 211b and 211c to occupy the area 332 located at the top edge, or a first side, of the primary mirror 210, and an area 334 located at the bottom edge, or opposite side, of the primary mirror 210. The ±1 diffraction orders 211b and 211c from the grating in the object plane are generally ultimately imaged just below the object plane on an opposite side of an optical axis. The central location of the opening 330 generally corresponds to the location of a zero diffraction order. The zero diffraction order 211a, which generally has a relatively small intensity, passes back through the opening 330 in the primary mirror 210. The zero diffraction order 211a is not imaged. In other words, the zero diffraction order 211a is eliminated, which results in doubled frequency of grating lines to be imaged.

The distance between the vertex of the primary mirror 210 and the substrate is generally between about 50 mm and about 500 mm, for example, about 85 mm. Larger optical systems yield larger field sizes and therefore use fewer columns to span a given field, but each optical system costs more. Thus, the field size is often a question of economics.

The field size of the system shown in FIGS. 1 and 2A-2C is about 2 mm by about 13.3 mm and the numerical aperture (NA) is 0.8875, which is high for such an optical system. Increased NA is made possible because a very small portion of the primary mirror 210 is used, which improves the results of the design optimization process. In operation, the illumination beam 211 passes through the centrally-located opening 330 of the primary mirror 210 and projects ±1 diffraction orders onto a substrate, but does not project the zero diffraction order. The elimination of the zero diffraction order doubles the frequency of the wires of the WGP pattern imaged on the substrate. The Markle-Dyson exposure system 102 is capable of providing aerial images with a steep profile and robust modulation.

Dual Tone Development (DTD) is a double-patterning process that does not utilize two separate lithography operations or utilize etched sidewall spacers to halve the feature pitch or double the feature frequency. Instead, DTD uses a positive tone and a negative tone development in a single development sequence with a single layer of photoresist. Generally, DTD includes using a positive tone aqueous developer solution to develop the positive tone and then using a solvent to develop the negative tone. Conventionally, DTD utilizes a chemically amplified resist (CAR) during a post-exposure bake (PEB) process to allow one photon to trigger the deprotection of hundreds to thousands of acid-catalyzed deprotection reactions; however, CAR is generally not used for display lithography manufacturing processes.

Because the Markle-Dyson exposure system 102 is capable of providing aerial images having a steep profile and robust modulation, it can be used in a combination process with DTD to produce WGPs having less than or equal to 100 nm pitch.

Figure 4:
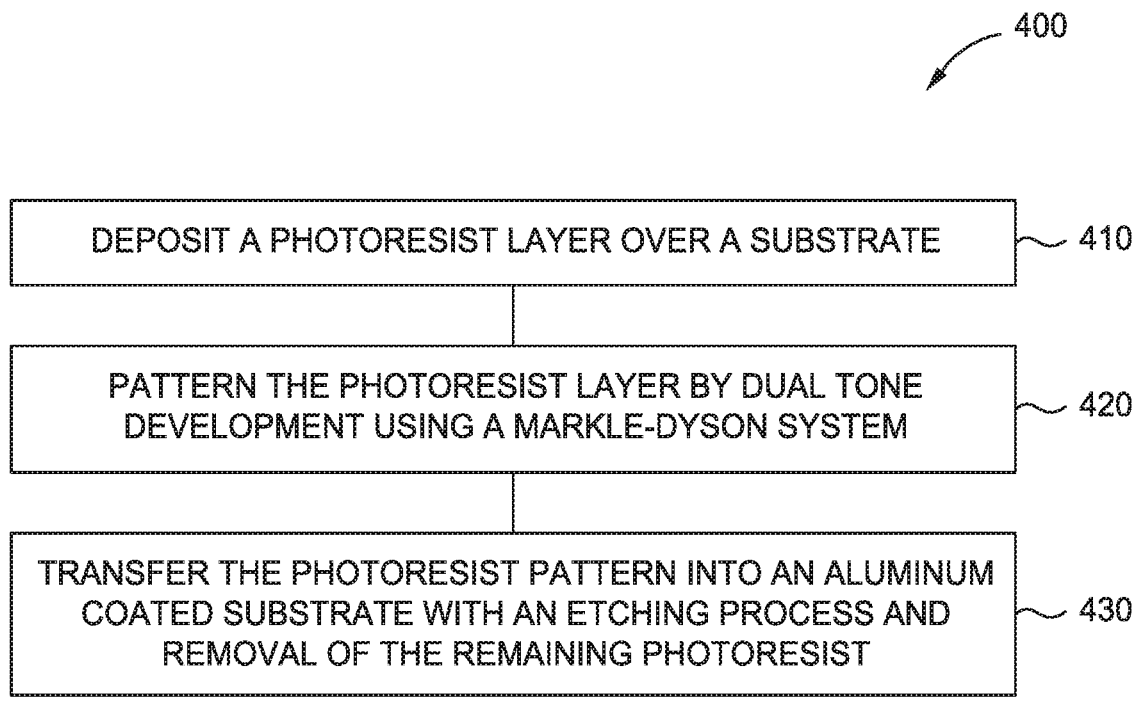
FIG. 4 is a flow diagram summarizing a method according to embodiments described herein.

FIG. 4 is a flow diagram summarizing a method 400 for manufacturing a WGP according to embodiments described herein. FIGS. 5A-5E depict schematic cross-sectional side views of a display substrate 550 having an aluminum coating 552 thereon at various operations of the method 400. To facilitate explanation, FIGS. 5A-5E will be explained in conjunction with FIG. 4.

Figure 5A:
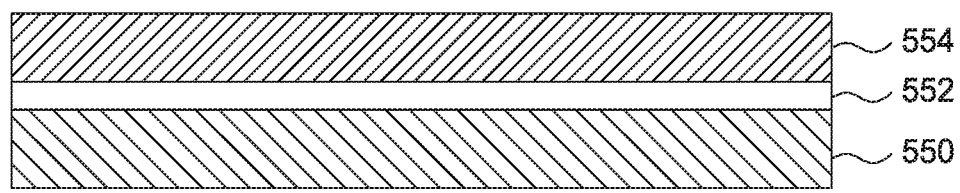
FIGS. 5A-5E depict schematic cross-sectional side views of stages of fabrication of a WGP on a display substrate according to embodiments described herein.

The method 400 begins at operation 410 by depositing a layer of dual tone photoresist material 554 over the display substrate 550 having the aluminum coating 552 thereon, as shown in FIG. 5A. In one embodiment, the layer of dual tone photoresist material 554 is deposited on and in contact with the aluminum coating 552. In one embodiment, the photoresist material 554 is a novolac/DNQ type photoresist, which does not need PEB processes. Novolacs are generally phenol-formaldehyde resins with a formaldehyde to phenol molar ratio of less than one. In one embodiment, the novolac/DNQ type photoresist includes a mixture of a phenol formaldehyde resin and diazonaphthoquinone (DNQ). In another embodiment, the photoresist material 554 includes a mixture of both positive-acting novolac/DNQ type photoresist and a negative-acting polyvinylacetal polymer water-soluble photoactive compound (PAC), which are mixed together using a crosslinking agent. In yet another embodiment, the photoresist material 554 includes a positive photoresist material blended with a negative-acting photoresist material with PAC additives that can be developed by a negative photoresist developer. In still further embodiments, the photoresist material 554 is any material(s) or mixtures thereof that do not employ deprotection CAR type material, or any material(s) or mixtures thereof having sufficient quantum efficiency.

In one embodiment, the method 400 further includes depositing a bottom anti-reflective coating (BARC) layer over the substrate to control the critical dimension (CD) across a surface of the display substrate 550.

At operation 420, the layer of photoresist material 554 is patterned by dual tone development to develop a positive tone and a negative tone using a Markle-Dyson exposure system 102. More particularly, the dual tone development begins by depositing a mask 556 over the layer of photoresist material 554 and exposing the photoresist material 554 to an illumination beam through a Markle-Dyson exposure system 102 (as described above). When the illumination beam passes through the mask 556 from the Markle-Dyson exposure system 102, a light exposure profile 555 is formed having high-intensity profile portions 555a which have high light exposure intensity, middle-intensity profile portions 555b which have middle light exposure intensity, and low-intensity profile portions 555c which have low light exposure intensity.

Figure 5B:
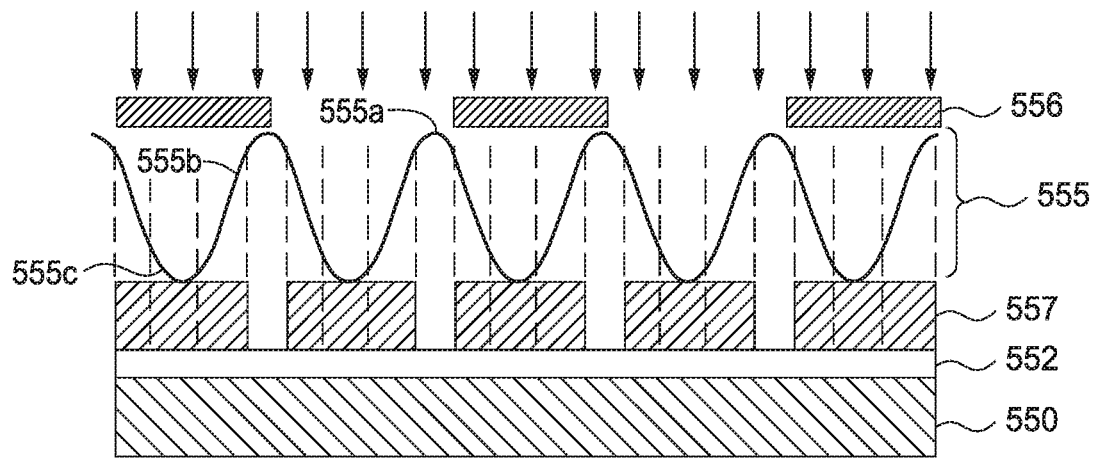
Figure 5C:
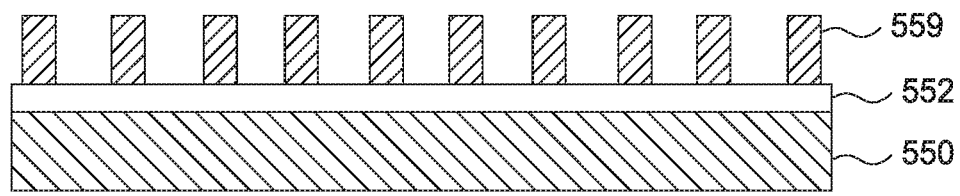

When a first positive tone development process is performed after the light exposure through the Markle-Dyson system, a preliminary pattern 557 of the photoresist material 554 is formed on the substrate 550 having the aluminum coating 552, as shown in FIG. 5B. The first positive tone development generally develops and removes the portions of the photoresist material 554 corresponding to the high-intensity profile portions having high light exposure intensity. These portions are generally removed using a first developing solution. Then, a second negative tone development is performed, forming a second pattern 559 of photoresist material 554, as shown in FIG. 5C. The second negative tone development generally develops and removes the portions of the photoresist material 554 corresponding to the low-intensity profile portions having low light exposure intensity, and leaves the portions corresponding to the middle-intensity profile portions having middle light exposure intensity. These portions are generally removed using a second developing solution, such as an organic solvent.

Figure 5D:
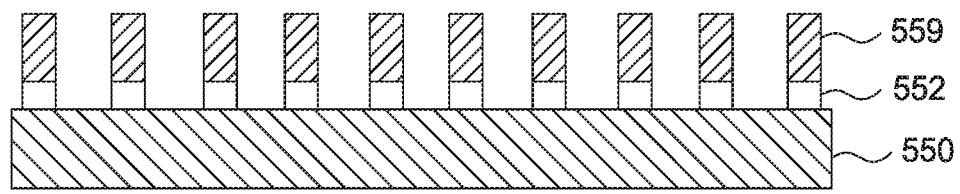
Figure 5E:
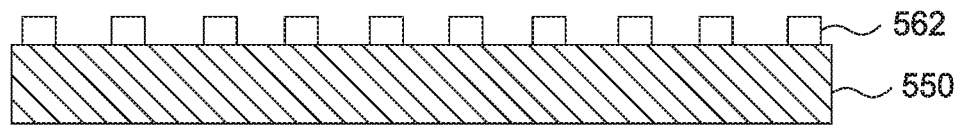

At operation 430, the photoresist pattern is transferred into the display substrate 550 having the aluminum coating 552, as shown in FIG. 5D. The remaining photoresist material 554 (shown as second pattern 559) is then removed such that what remains is a fine grid of aluminum wires (or WGP) 562 having a fine, single pitch and increased frequency, as shown in FIG. 5E. In one embodiment, the fine grid of aluminum wires 562 has a pitch of less than or equal to 200 nm, for example less than or equal to 100 nm. In one embodiment, the fine grid of aluminum wires 562 has a pitch of 100 nm. When the pitch is 100 nm, the photoresist pattern generally includes alternating 50 nm lines and 50 nm spaces. In another embodiment, the fine grid of aluminum wires 562 has a pitch of 50 nm. When the pitch is 50 nm, the photoresist pattern generally includes alternating 25 nm wires and 25 nm spaces. In yet another embodiment, the fine grid of aluminum wires 562 has a pitch of 80 nm. When the pitch is 80 nm, the photoresist pattern generally includes alternating 40 nm wires and 40 nm spaces. In one embodiment, the fine grid of aluminum wires 562 includes a repeating pattern of rectangular units, each having the same pitch. In such an embodiment, the fine grid of aluminum wires 562 generally does not include any other patterns, or any grid units having different pitches.

Figure 6:
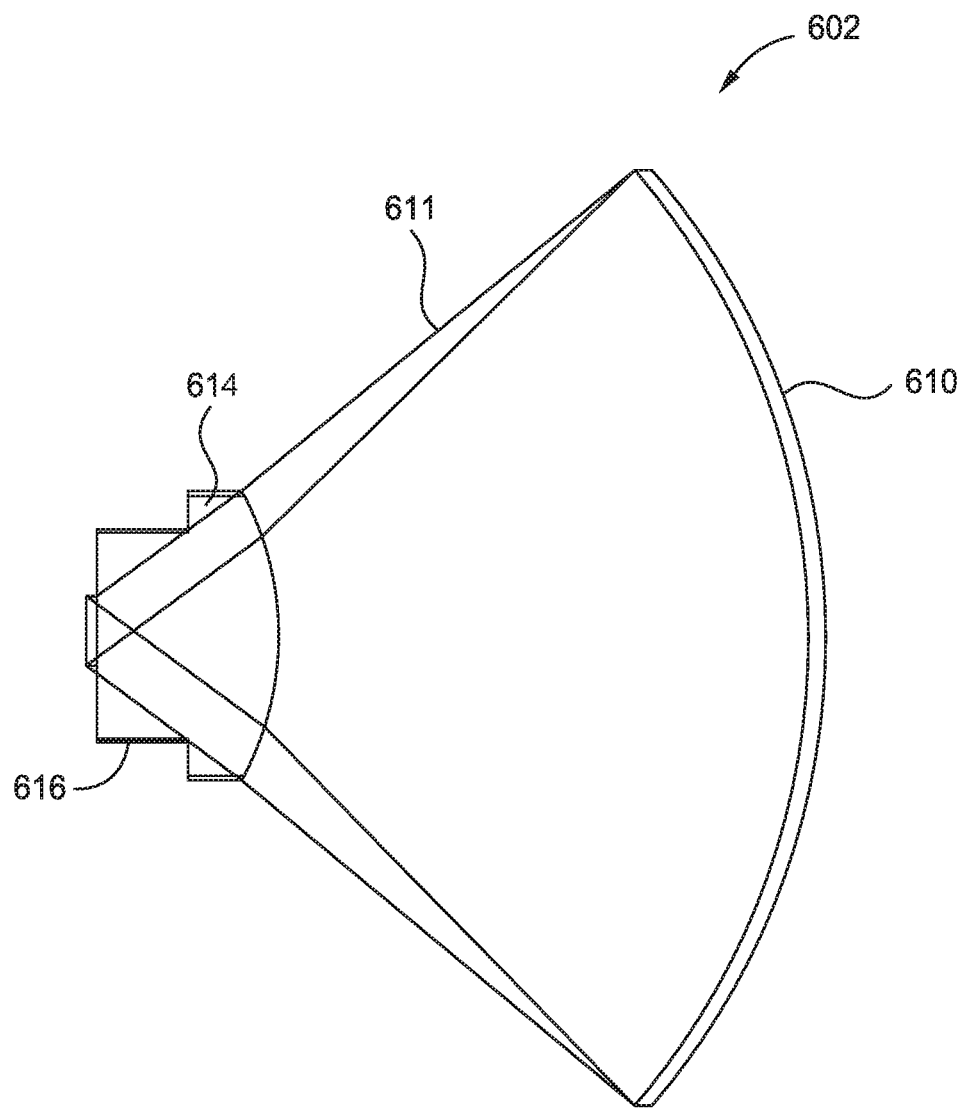
FIG. 6 is a Markle-Dyson system according to embodiments described herein.

FIG. 6 is a Markle-Dyson system 602 which is useful in the system 100 according to embodiments described herein. The Markle-Dyson system 602 includes a primary mirror 610, a positive lens 614, and a reticle 616. In one embodiment, the primary mirror 610 is a weakly aspheric mirror. In one embodiment, the positive lens 614 is a glass lens. The reticle 616 generally has any suitable height, for example, between about 10 mm about 20 mm, such as 14 mm, and any suitable thickness, for example, between about 1 mm and about 6.35 mm, such as about 2.286 mm. Laser illumination beam 611 passes through the through the positive lens 614 to create a normally incident, collimated beam on the reticle 616. Embodiments of the present disclosure also provide uniform illumination across the field. The laser illumination beam 211 is Gaussian shaped. In order to provide a uniform exposure dose across the field, the Gaussian shape of the laser illumination beam 211 is used to illuminate a grating in which the lines vary in length depending on the intensity of the illumination beam at that point.

Figure 7:
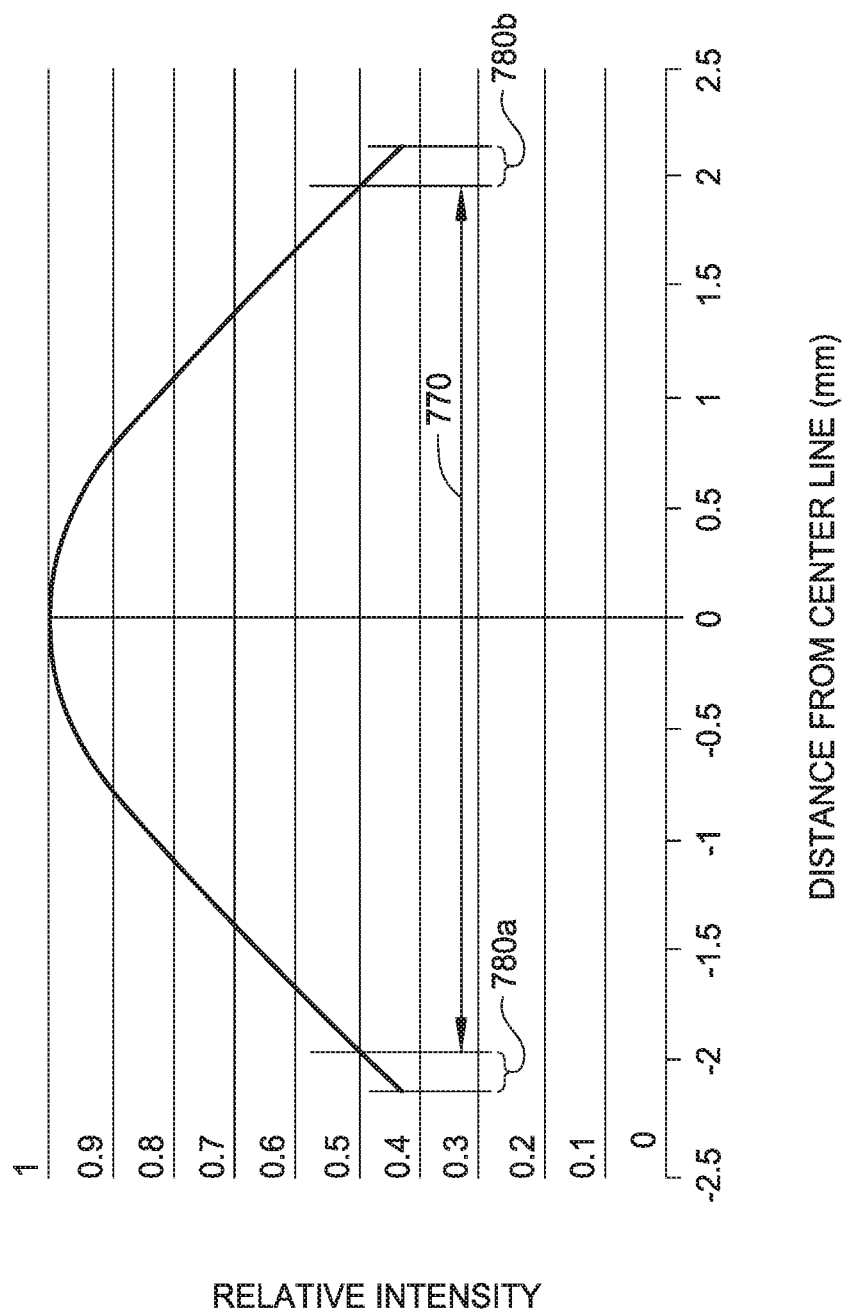
FIG. 7 is a graph illustrating a Gaussian profile of a laser illumination beam along a grating length according to embodiments described herein.

FIG. 7 is a graph illustrating a Gaussian profile of a laser illumination beam 211 along a grating length. Portion 770 of the curve represents the portion of the laser illumination beam 211 that is not overlapped with the adjacent beam. End portions 780a and 780b represent portions of the curve that are overlapped with the adjacent beam. The exposure dose of end portions 780a and 780b are linearly tapered from 100% to 0% so overlapping exposures result in a uniform dose in the overlapped area. Tapering the end portions 780a and 780b provides for overlapping exposure doses that appear to be seamless, because small overlap errors do not generate abrupt exposure differences.

Figure 8:
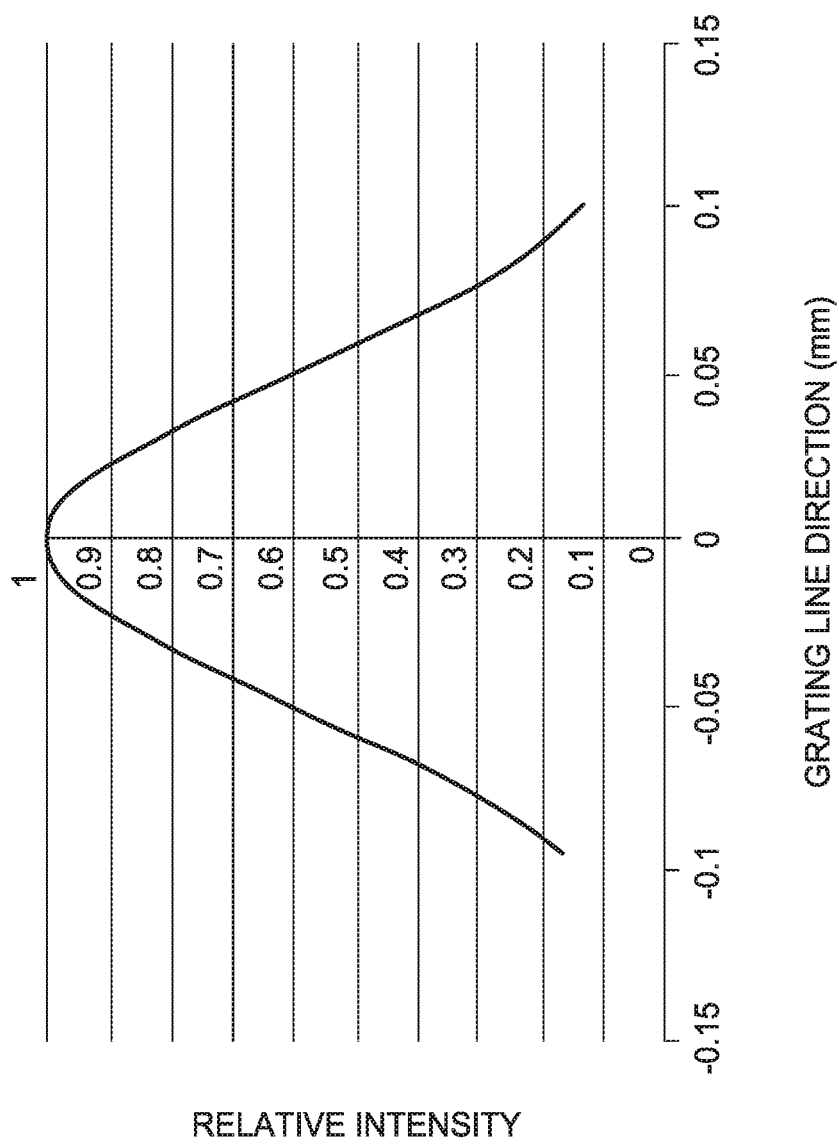
FIG. 8 is a graph illustrating a profile of a laser illumination beam along a grating line according to embodiments described herein.

FIG. 8 is a graph illustrating a profile of a laser illumination beam 211 along a grating line. More particularly, FIG. 8 illustrates the profile of the laser illumination beam 211 at the longest grating line at that profile.

Figure 9:
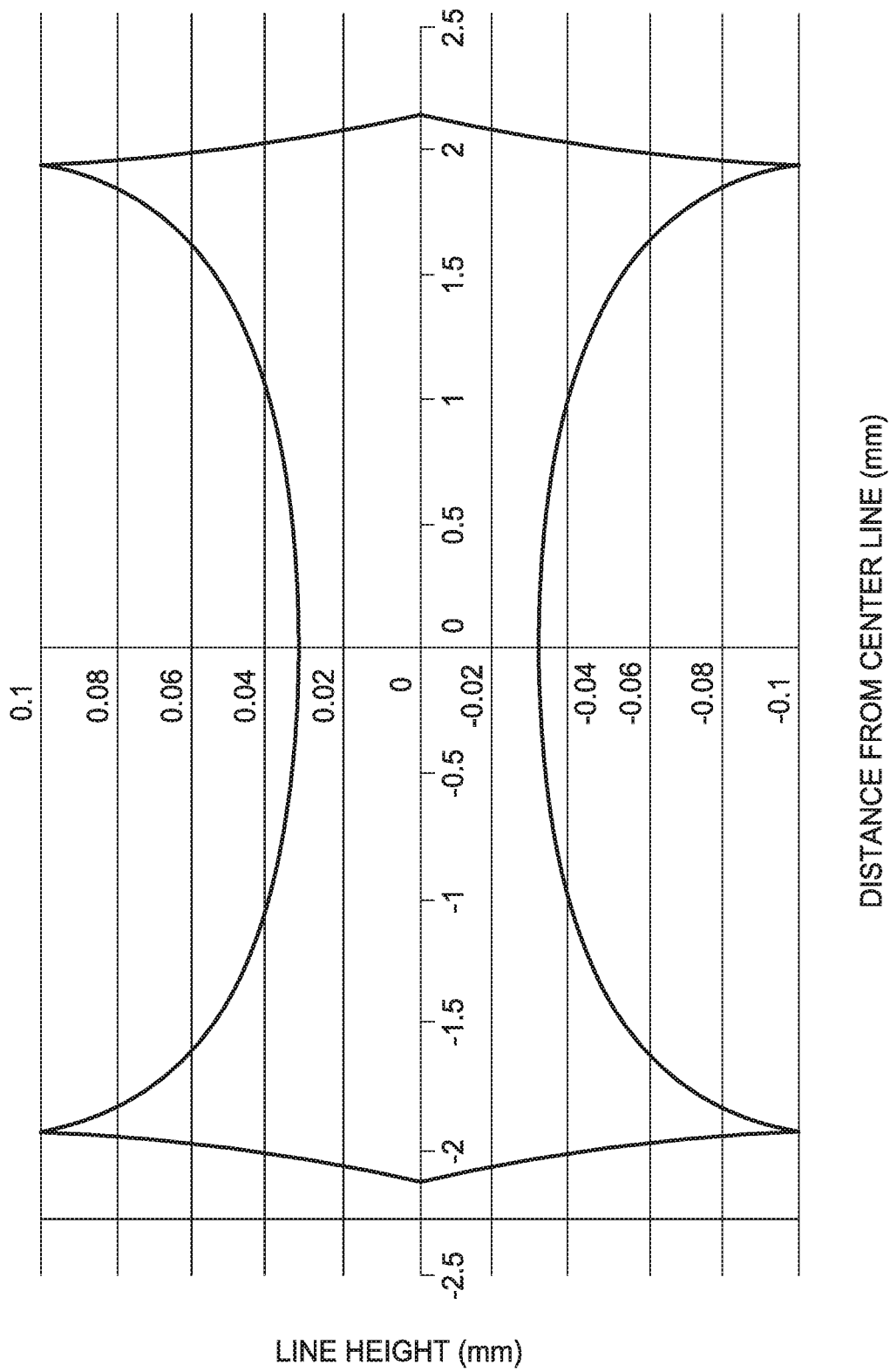
FIG. 9 is a graph illustrating the variation in grating line height (or length) with distance from a center line according to embodiments described herein.

FIG. 9 is a graph illustrating the variation in grating line height (or length) with distance from a center line. In order to control exposure dose, the laser illumination beam 211 is most intense in the center, so the grating lines closest to the center are shorter, or have less height, for example about 0.03 mm. Moving along the grating towards the edge of the field, the length of the grating lines may get progressively longer, or the height may increase, for example about 0.1 mm long. Varying the length of the grating line inversely to the integrated intensity of the laser illumination beam 211, as shown in FIGS. 7-8, results in providing the same exposure dose across the field. The exposure dose is the integrated intensity over the time a point on the substrate is exposed. Exposure time is proportional to the length, or height, of the grating line.

By changing the lengths of the grating lines across the field as shown in FIGS. 7-9, the exposure dose over the substrate may be controlled. More particularly, the variation of the lengths of the grating lines across the field results in a uniform exposure dose from one end of the grating to the other despite the fact that the laser illumination beam 211 has a very non-uniform, Gaussian shape.

Benefits of methods and systems disclosed herein, which combine the Markle-Dyson exposure system(s) and DTD, include producing WGPs having finer, single pitch, such as less than or equal to about 100 nm. When a Markle-Dyson exposure system is used, the pitch is controlled by the mask, which reduces or eliminates pitch variation. When DTD is used, the frequency of the pitch is doubled such that the single, unvaried pitch of the Markle-Dyson exposure system is duplicated or doubled in a single operation. Thus, use of the Markle-Dyson exposure system and DTD process produces WGPs having finer, single pitch with reduced or eliminated pitch variation. Additionally, the Markle-Dyson produces robust aerial image profiles having improved sinusoidal image modulation with very high contrast. The disclosed methods and systems produce display devices having improved mura, or systems having reduced or no discernable disturbance visual to the human eye.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
depositing a photosensitive polymer layer over a substrate;
illuminating a reflective phase mask with an illumination beam passing through a Markle-Dyson system comprising a primary mirror, wherein illuminating the reflective phase mask forms a set of diffraction orders;
using selected plus and minus first order diffraction orders from the set of diffraction orders of the reflective phase mask using a surface of the primary mirror, wherein the plus and minus first order diffraction orders occupy a peripheral portion of the surface of the primary mirror, wherein the primary mirror is capable of excluding certain diffraction orders generated by the reflective phase mask; and
exposing the photosensitive polymer layer to diffraction orders consisting of the selected first order diffraction orders directed from the surface of the primary mirror to form a light exposure image.

2. The method of claim 1, wherein illuminating the reflective phase mask comprises illuminating the reflective phase mask with an illumination beam emerging through an opening of the primary mirror of the Markle-Dyson system.

3. The method of claim 1, wherein illuminating the reflective phase mask with the illumination beam comprises positioning the reflective phase mask in an object plane of a Markle-Dyson system.

4. The method of claim 1, wherein the selected diffraction orders reflected from the primary mirror of the Markle-Dyson system are overlapped at an image plane of the Markle Dyson system.

5. The method of claim 1, further comprising:
developing the light exposure image of the photosensitive polymer to form a developed photosensitive polymer; and
transferring the developed photosensitive polymer into a metal layer of the substrate to form a wire grid polarizer.

6. The method of claim 5, wherein developing the photosensitive polymer comprises dual tone development.

7. The method of claim 1, wherein the reflective phase mask is a reflective phase grating mask.

8. The method of claim 1, wherein the primary mirror is a spherical mirror with a concave side facing the reflective phase mask.

9. The method of claim 1, wherein the Markle-Dyson system comprises a positive lens coupled to the primary mirror, and a reticle coupled to the positive lens, wherein the reflective phase mask comprises a grid of lines having a single pitch of less than or equal to about 200 nanometers.

10. The method of claim 1, wherein imaging the light exposure image on the photosensitive polymer layer comprises positioning the photosensitive polymer layer with respect to an image plane of the Markle-Dyson system.

11. The method of claim 1, wherein the photosensitive polymer layer is a frequency doubling resist.

12. The method of claim 11, wherein the frequency doubling resist comprises positive photoresist material blended with a negative-acting photoresist material with photoactive compound additives that can be developed by a negative photoresist developer.

13. The method of claim 1, wherein the light exposure image has a grating frequency of the light exposure image that is double a grating frequency of the reflective phase mask.

14. A method, comprising:
depositing a photosensitive polymer layer over a substrate;
illuminating a reflective phase mask with an illumination beam passing through a center opening of a primary mirror, and through one or more lenses comprising a positive lens of a Markle-Dyson system, wherein illuminating the reflective phase mask forms a set of diffraction orders, wherein the illuminating beam from the set of diffraction orders are separated and spread across the primary mirror;
using selected plus and minus first order diffraction orders of the set of diffraction orders incident on a surface of the primary mirror of the Markle-Dyson system, wherein the plus and minus first order diffraction orders occupy a peripheral portion of the surface of the primary mirror, wherein the selected first order diffraction orders are superimposed on an image plane and are overlapped; and
exposing the photosensitive polymer layer disposed on the image plane of the Markle-Dyson system to diffraction orders consisting of the selected first order diffraction orders from the surface of the primary mirror to form a light exposure image.

15. A method, comprising:
depositing a photosensitive polymer layer over a substrate;
illuminating a reflective phase mask with an illumination beam, wherein illuminating the reflective phase mask forms a set of diffraction orders;
using selected plus and minus first order diffraction orders of the set of diffraction orders of the reflective phase mask using a surface of a primary mirror of a Markle-Dyson system, wherein the plus and minus first order diffraction orders occupy a peripheral portion of the surface of the primary mirror; and
exposing the photosensitive polymer layer to diffraction orders consisting of the selected first order diffraction orders from the surface of the primary mirror to form a light exposure image used for an optical component.

16. The method of claim 15, further comprising transferring the light exposure image into the substrate or into a layer disposed between the substrate and the photosensitive polymer layer.

17. The method of claim 16, wherein transferring the light exposure image comprises etching the substrate and removing any remaining photosensitive polymer layer after transferring the light exposure image into the substrate.

18. The method of claim 15, further comprising depositing a bottom anti-reflective coating layer over the substrate, wherein the substrate is an aluminum-coated display substrate.

19. The method of claim 18, further comprising:
depositing the photosensitive polymer layer over the substrate, wherein the photosensitive polymer layer is a frequency doubling photoresist layer;
patterning the frequency doubling resist by dual tone development using the Markle-Dyson system to form a photoresist pattern comprising a light exposure profile having high-intensity profile portions, middle-intensity profile portions, and low-intensity profile portions, wherein the Markle-Dyson system comprises a primary mirror, a positive lens coupled to the primary mirror, and a reticle coupled to the positive lens, wherein the photoresist pattern consists of a grid of lines having a single pitch of less than or equal to about 200 nanometers, wherein the dual tone development comprises:
performing a first positive tone development process using a first developing solution to form a preliminary pattern by developing and removing portions of the photoresist layer corresponding to the high-intensity profile portions, and
performing a second negative tone development process using a second developing solution to form a second pattern by developing and removing portions of the photoresist layer corresponding to the low-intensity profile portions;
transferring the photoresist pattern into the aluminum-coated display substrate; and
removing any remaining frequency doubling resist from the aluminum-coated display substrate.

\* \* \* \* \*